United States Patent
Bae et al.

(10) Patent No.: US 11,940,368 B2
(45) Date of Patent: Mar. 26, 2024

(54) METHOD FOR PRE-DETECTING DEFECTIVE POROUS POLYMER SUBSTRATE FOR SEPARATOR

(71) Applicant: LG Energy Solution, Ltd., Seoul (KR)

(72) Inventors: Won-Sik Bae, Daejeon (KR); Joo-Sung Lee, Daejeon (KR); Ho-Sung Kang, Daejeon (KR); Yern-Seung Kim, Daejeon (KR); Se-Jung Park, Daejeon (KR); Je-Seob Park, Daejeon (KR); Ji-Young Hwang, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 0 days.

(21) Appl. No.: 18/032,565

(22) PCT Filed: Apr. 6, 2022

(86) PCT No.: PCT/KR2022/004989
§ 371 (c)(1),
(2) Date: Apr. 18, 2023

(87) PCT Pub. No.: WO2022/216063
PCT Pub. Date: Oct. 13, 2022

(65) Prior Publication Data
US 2023/0384200 A1 Nov. 30, 2023

(30) Foreign Application Priority Data
Apr. 6, 2021 (KR) .................. 10-2021-0044855

(51) Int. Cl.
*G01N 15/08* (2006.01)
*B07C 5/34* (2006.01)
(Continued)

(52) U.S. Cl.
CPC ......... *G01N 15/088* (2013.01); *B07C 5/3416* (2013.01); *G06T 7/0004* (2013.01);
(Continued)

(58) Field of Classification Search
CPC ..... G01N 15/088; G06T 7/168; G06T 7/0004; G06T 2207/10061; G06T 2207/20021;
(Continued)

(56) References Cited

U.S. PATENT DOCUMENTS

| | | | |
|---|---|---|---|
| 2015/0374028 A1 | 12/2015 | Gindrat et al. | |
| 2016/0204406 A1 | 7/2016 | Ryu et al. | |
| 2020/0141841 A1 | 5/2020 | Han | |

FOREIGN PATENT DOCUMENTS

| | | |
|---|---|---|
| JP | 2005-114418 A | 4/2005 |
| JP | 2010-272250 A | 12/2010 |

(Continued)

OTHER PUBLICATIONS

International Search Report (with partial translation) and Written Opinion dated Jul. 11, 2022, for corresponding International Patent Application No. PCT/KR2022/004989.

(Continued)

*Primary Examiner* — Nicole M Ippolito
*Assistant Examiner* — Hanway Chang
(74) *Attorney, Agent, or Firm* — Morgan, Lewis & Bockius LLP

(57) ABSTRACT

Disclosed is a method for pre-detecting a defective porous polymer substrate for a separator, including selecting a porous polymer substrate having a plurality of pores; observing the selected porous polymer substrate with a scanning electron microscope (SEM) to obtain an image of the porous polymer substrate; quantifying the average value of pore distribution index (PDI); correcting the quantified average value of pore distribution index to obtain the
(Continued)

corrected average value of pore distribution index; determining whether or not the corrected average value of pore distribution index is 60 a.u. (arbitrary unit) or less; and classifying the porous polymer substrate as a good product, when the corrected average value of pore distribution index is determined to be 60 a.u. or less, and classifying the porous polymer substrate as a defective product, when the corrected average value of pore distribution index is determined to be larger than 60 a.u.

7 Claims, 19 Drawing Sheets

(51) Int. Cl.
    *G06T 7/00*               (2017.01)
    *G06T 7/168*             (2017.01)
    *H01J 37/26*             (2006.01)

(52) U.S. Cl.
    CPC .............. *G06T 7/168* (2017.01); *H01J 37/26* (2013.01); *G06T 2207/10061* (2013.01); *G06T 2207/20021* (2013.01); *G06T 2207/20048* (2013.01); *G06T 2207/30108* (2013.01)

(58) Field of Classification Search
    CPC . G06T 2207/20048; G06T 2207/30108; B07C 5/3416; H01J 37/26
    See application file for complete search history.

(56) References Cited

FOREIGN PATENT DOCUMENTS

| | | | |
|---|---|---|---|
| JP | 2012-107936 | A | 6/2012 |
| KR | 0148871 | B1 | 12/1998 |
| KR | 10-2005-0088728 | A | 9/2005 |
| KR | 10-1666045 | B1 | 10/2016 |
| KR | 10-2017-0081444 | A | 7/2017 |
| KR | 10-2018-0130462 | A | 12/2018 |
| KR | 10-2024890 | B1 | 9/2019 |
| KR | 10-2020-0088657 | A | 7/2020 |
| KR | 10-2173447 | B1 | 11/2020 |

OTHER PUBLICATIONS

Ziel et al., "Quantification of the pore size distribution (porosity profiles) in microfiltration membranes by SEM, TEM and computer image analysis," Journal of Membrane Science, 2008, vol. 323, No. 2, pp. 241-246.
She et al., "Calculation of effective pore diameters in porous filtration membranes with image analysis," Robotics and Computer-Integrated Manufacturing, 2008, vol. 24, pp. 427-434.
International Search Report issued in corresponding International Patent Application No. PCT/KR2022/004989 dated dated Jul. 11, 2022.
Written Opinion issued in corresponding International Patent Application No. PCT/KR2022/004989 dated Jul. 11, 2022.

2-D BINARY IMAGE

RAW IMAGE

2-D BINARY IMAGE

AVERAGE PDI BEFORE CORRECTION

38.05 ± 25.48

METHOD FOR PRE-DETECTING DEFECTIVE POROUS POLYMER SUBSTRATE FOR SEPARATOR

TECHNICAL FIELD

The present disclosure relates to a method for pre-detecting a defective porous polymer substrate for a separator.

The present application claims priority to Korean Patent Application No. 10-2021-0044855 filed on Apr. 6, 2021 in the Republic of Korea, the disclosures of which are incorporated herein by reference.

BACKGROUND ART

Recently, energy storage technology has been given an increasing attention. Efforts into research and development for electrochemical devices have been actualized more and more, as the application of energy storage technology has been extended to energy for cellular phones, camcorders and notebook PCs and even to energy for electric vehicles. In this context, electrochemical devices have been most spotlighted. Among such electrochemical devices, development of rechargeable secondary batteries has been focused. More recently, active studies have been conducted about designing a novel electrode and battery in order to improve the capacity density and specific energy in developing such batteries.

Among the commercially available secondary batteries, lithium secondary batteries developed in the early 1990's have been spotlighted, since they have a higher operating voltage and significantly higher energy density as compared to conventional batteries, such as Ni—MH, Ni—Cd and sulfuric acid-lead batteries using an aqueous electrolyte.

Such a lithium secondary battery includes a positive electrode, a negative electrode, an electrolyte and a separator. Particularly, it is required for the separator to have insulation property for separating and electrically insulating the positive electrode and the negative electrode from each other and high ion conductivity for increasing lithium-ion permeability based on high porosity.

In general, such a separator may be applied in the form of a porous polymer substrate obtained by kneading a polymer, such as polyolefin, with a diluting agent, carrying out extrusion and orientation to form a film, and extracting the diluting agent by using a solvent, etc. to form pores. Otherwise, the separator may be applied in the form of a composite separator including an organic-inorganic composite porous layer containing a binder polymer and inorganic particles and provided on at least one surface of the porous polymer substrate.

Herein, the porous polymer substrate applied to the separator for a secondary battery may have diversely controlled physical properties depending on the processing condition during the manufacture thereof. Particularly, the pore structure of the porous polymer substrate functioning as a lithium-ion channel may also be modified diversely depending on the processing condition.

Particularly, when excessive heat is applied during an orientation step, some issues may occur, and for example, the finished porous polymer substrate may have a large pore size, the porous polymer substrate may show a non-uniform surface morphology, or the fibrils of the polymer contained in the porous polymer substrate may be formed with a large thickness. Such issues are problematic in that when the porous polymer substrate is applied in the form of a composite separator, the separator shows an excessively increased air permeation time, after the organic-inorganic composite porous layer is formed.

This cannot be observed by determining the physical properties, such as air permeation time, of a separator unit. Particularly, when the pore size is determined by using a capillary flow porometer, the measurement varies from site to site, which is unfavorable in terms of quality control.

Therefore, there is a need for a method for easily detecting a defective product in terms of pore size (non-uniform morphology) for the purpose of quality control of the porous polymer substrate used as a substrate for a separator.

DISCLOSURE

Technical Problem

The present disclosure is designed to solve the problems of the related art, and therefore the present disclosure is directed to providing a method for pre-detecting a defective porous polymer substrate for a separator to facilitate determination of the appearance of a separator for the purpose of quality control.

Technical Solution

In one aspect of the present disclosure, there is provided a method for pre-detecting a defective porous polymer substrate for a separator according to any one of the following embodiments.

According to the first embodiment, there is provided a method for pre-detecting a defective porous polymer substrate for a separator, including the steps of:

selecting a porous polymer substrate having a plurality of pores to detect whether it is a good product or a defective product;

observing the selected porous polymer substrate with a scanning electron microscope (SEM) to obtain an image of the porous polymer substrate;

quantifying the average value of pore distribution index (PDI) by using the obtained image of the porous polymer substrate;

correcting the quantified average value of pore distribution index to obtain the corrected average value of pore distribution index;

determining whether or not the corrected average value of pore distribution index is 60 a.u. (arbitrary unit) or less; and classifying the porous polymer substrate as a good product, when the corrected average value of pore distribution index is determined to be 60 a.u. or less, and classifying the porous polymer substrate as a defective product, when the corrected average value of pore distribution index is determined to be larger than 60 a.u.

According to the second embodiment, there is provided the method for pre-detecting a defective porous polymer substrate for a separator as defined in the first embodiment, wherein the step of quantifying the average value of pore distribution index is carried out by processing the image of the porous polymer substrate taken with a scanning electron microscope (SEM) through the mathematical theory (Euclidean distance measurement) and a computer engineering algorithm.

According to the third embodiment, there is provided the method for pre-detecting a defective porous polymer substrate for a separator as defined in the second embodiment, wherein the step of quantifying the average value of pore distribution index includes calculating a distance between pores and pore size from the image of the porous polymer substrate taken with a scanning electron microscope (SEM).

According to the fourth embodiment, there is provided the method for pre-detecting a defective porous polymer substrate for a separator as defined in the second or the third embodiment, wherein the step of quantifying the average value of pore distribution index includes:

acquiring a two-dimensional (2-D) binary image in which the pixels of the raw image of the porous polymer substrate taken with a scanning electron microscope (SEM) are divided into pixels representing a plurality of polymer fibril regions adjacent to each other or spanning each other and pixels representing pore regions formed among the plurality polymer fibrils;

carrying out distance transformation of the 2-D binary image by using the computational Euclidean distance transformation method; and applying local maxima calculation to the image subjected to distance transformation to extract the distance transformation values of all of the pixels in the image and carrying out statistical processing.

According to the fifth embodiment, there is provided the method for pre-detecting a defective porous polymer substrate for a separator as defined in any one of the first to the fourth embodiments, wherein the step of correcting the quantified average value (average PDI before correction) of pore distribution index to obtain the corrected average value (corrected average PDI) of pore distribution index is carried out through the calculation according to the following formula:

Corrected average PDI=Average PDI before correction×(1/η), wherein η represents a correction factor and is defined by the formula of η=(number of polymer fibril pixels)/(number of total image pixels).

According to the sixth embodiment, there is provided the method for pre-detecting a defective porous polymer substrate for a separator as defined in any one of the first to the fifth embodiments, wherein a separator, obtained by applying and drying a slurry containing inorganic particles, a binder polymer and a dispersion medium onto at least one surface of the porous substrate classified as a good product to form an organic-inorganic composite porous layer, has an air permeability of 600 sec/100 cc or less.

According to the seventh embodiment, there is provided the method for pre-detecting a defective porous polymer substrate for a separator as defined in any one of the first to the sixth embodiments, wherein the porous polymer substrate is classified as a good product, when the corrected average value of pore distribution index is determined to be 40 a.u. or less, and classified as a defective product, when the corrected average value of pore distribution index is determined to be larger than 40 a.u.

Advantageous Effects

The method for pre-detecting a defective porous polymer substrate for a separator according to an embodiment of the present disclosure can detect a defective product clearly by using a difference in image of the porous polymer substrate in the state of a porous polymer substrate as a separator substrate, before forming an organic-inorganic composite porous layer thereon, unlike the conventional method of determining a defective product in terms of air permeability, or the like, after finishing a separator including an organic-inorganic composite porous layer on at least one surface of the porous polymer substrate. In other words, the image of the porous polymer substrate obtained by observation with a scanning electron microscope (SEM) is used to quantify the average value of pore distribution index (PDI), and then the value obtained by correcting the quantified average value is compared with a predetermined reference value to determine whether the corrected value is larger or smaller than the reference value, thereby detecting a good product or a defective product of porous polymer substrate. In this manner, it is possible to significantly reduce the time and cost, as compared to the conventional method of determining a defective product in the state of a separator.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

BEST MODE

Figure 1A:
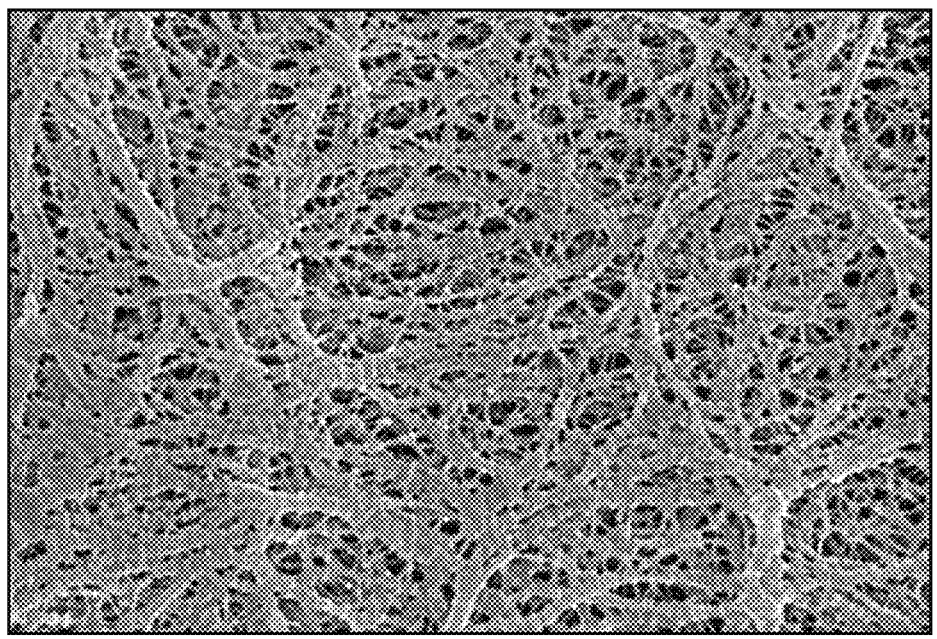
FIG. 1a, FIG. 2a, FIG. 3a, FIG. 4a and FIG. 5a illustrate the scanning electron microscopic (SEM) images of the porous polyolefin substrates according to Preparation Examples 1-5, respectively.
Figure 1B:
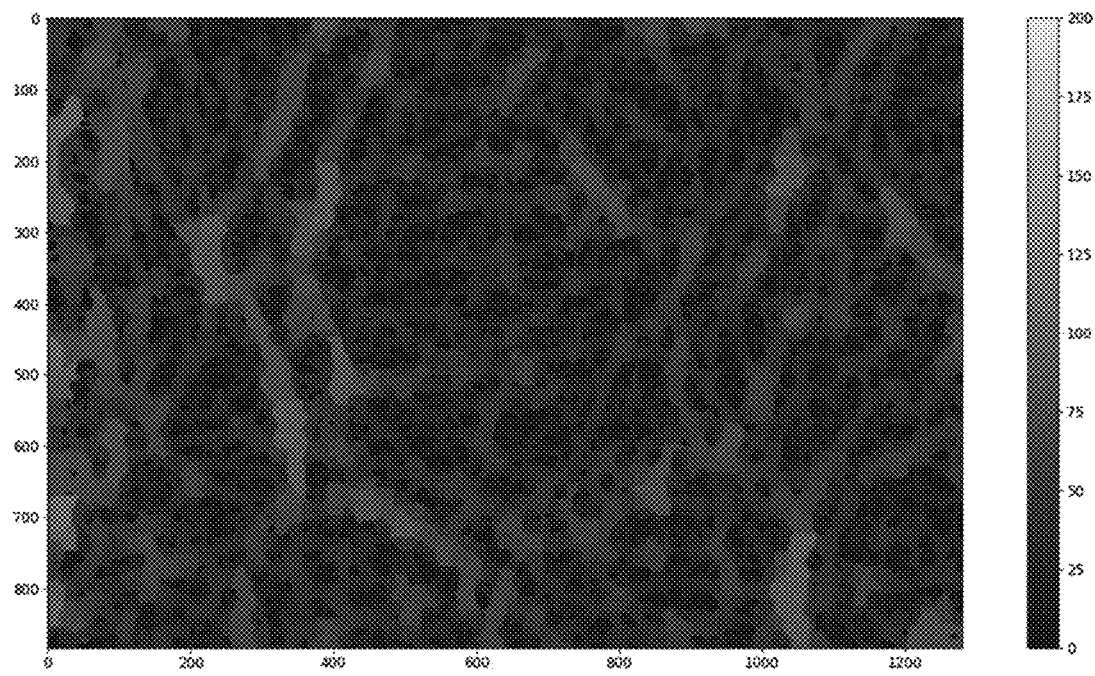
FIG. 1b, FIG. 2b, FIG. 3b, FIG. 4b and FIG. 5b illustrate the results of distance transformation of the porous polyolefin substrates according to Preparation Examples 1-5, respectively.
Figure 1C:
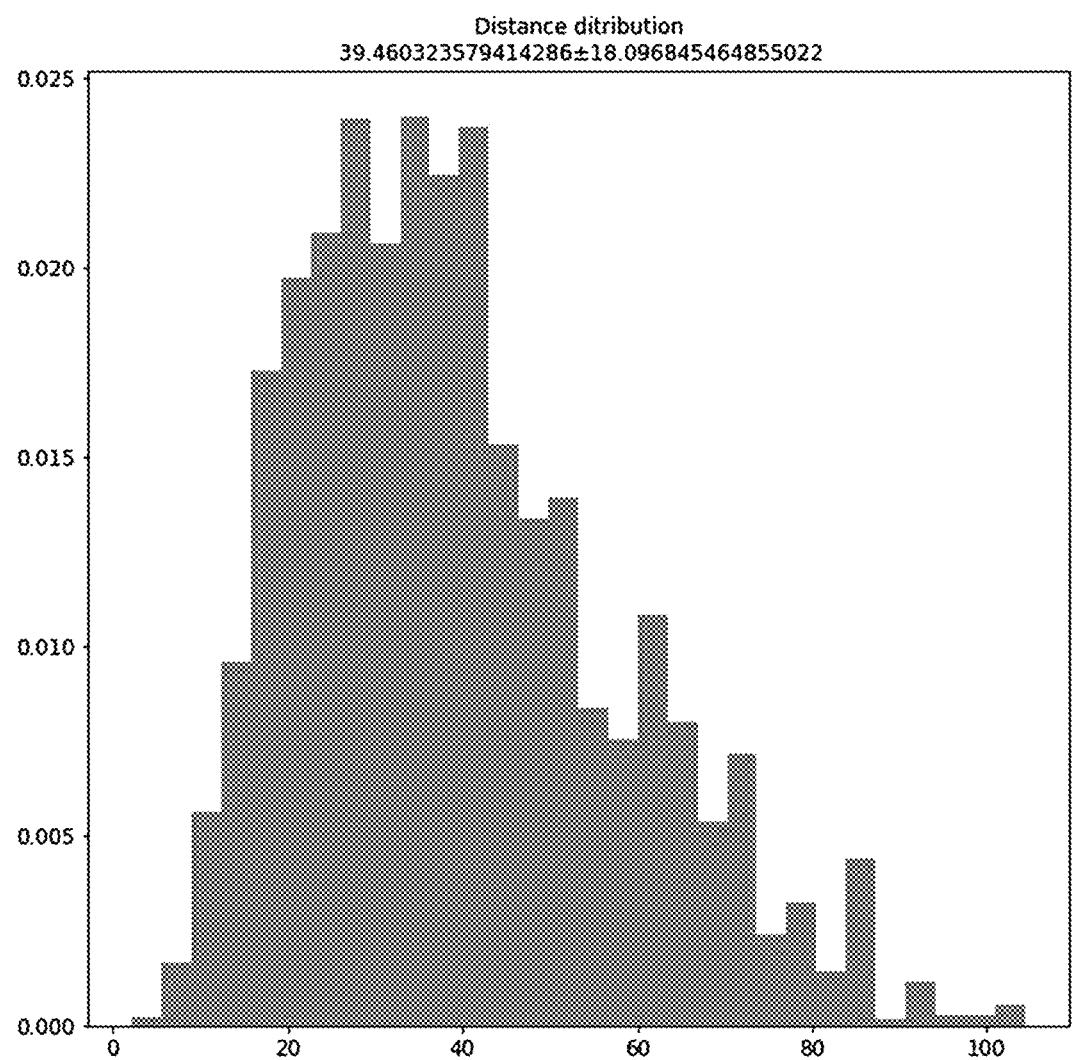
FIG. 1c, FIG. 2c, FIG. 3c, FIG. 4c and FIG. 5c illustrate the corrected average value of pore distribution index (corrected average PDI) according to Preparation Examples 1-5, respectively, and graphs of the corrected pore distribution index.
Figure 2A:
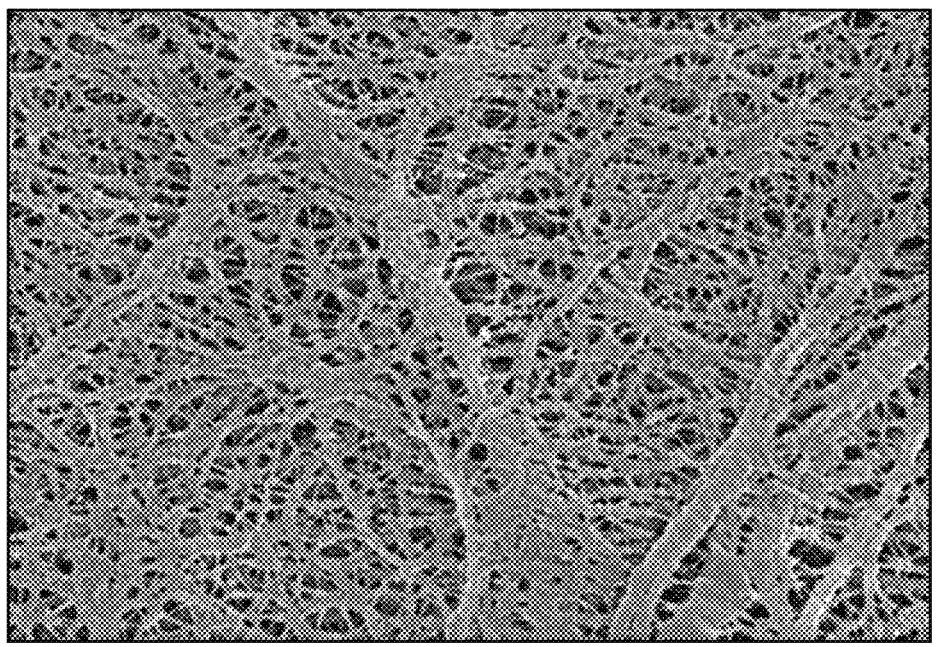
Figure 2B:
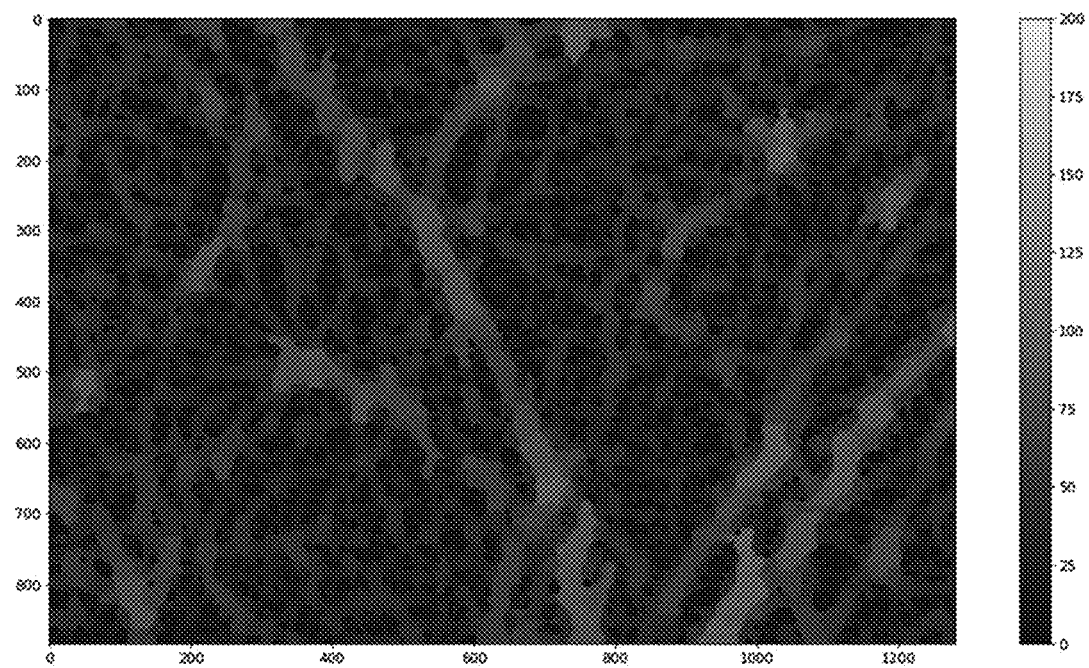
Figure 2C:
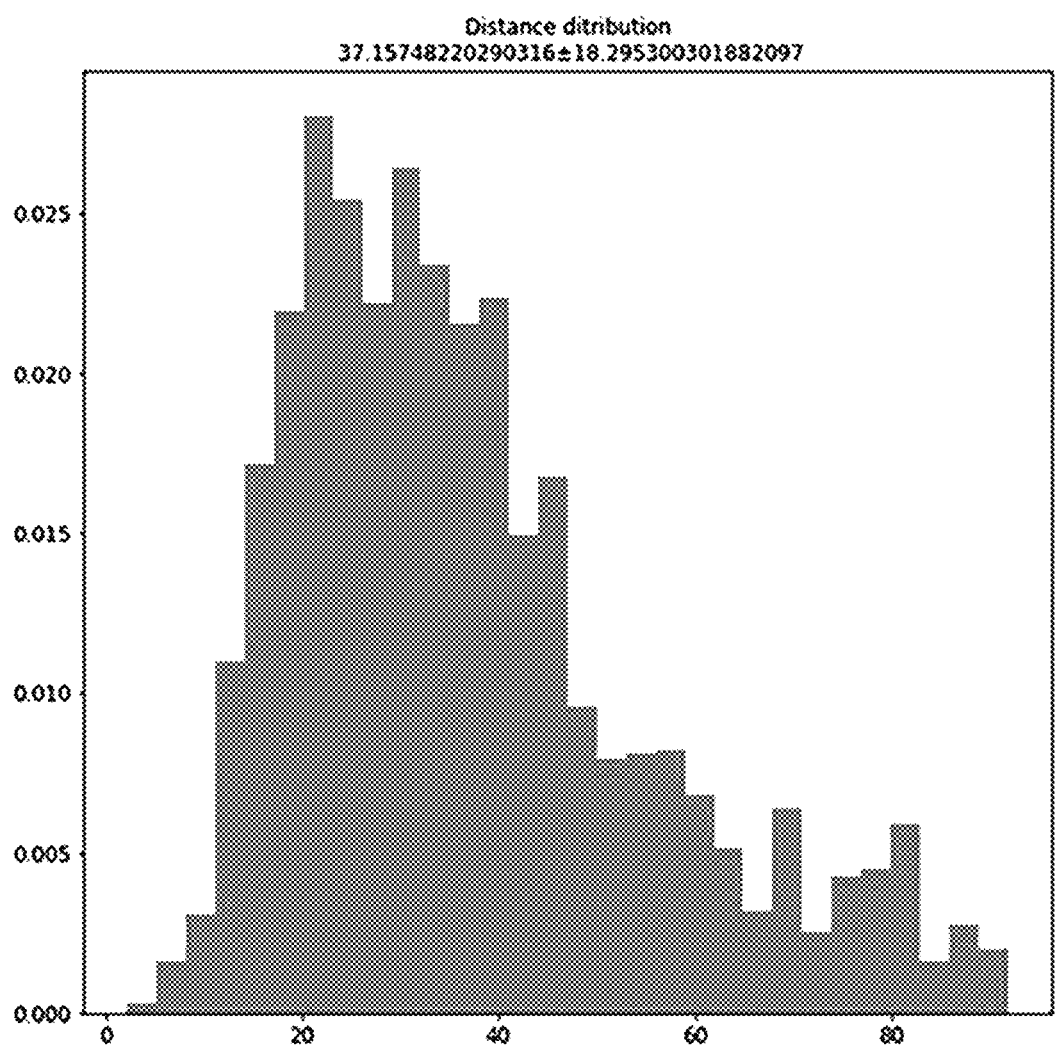
Figure 3A:
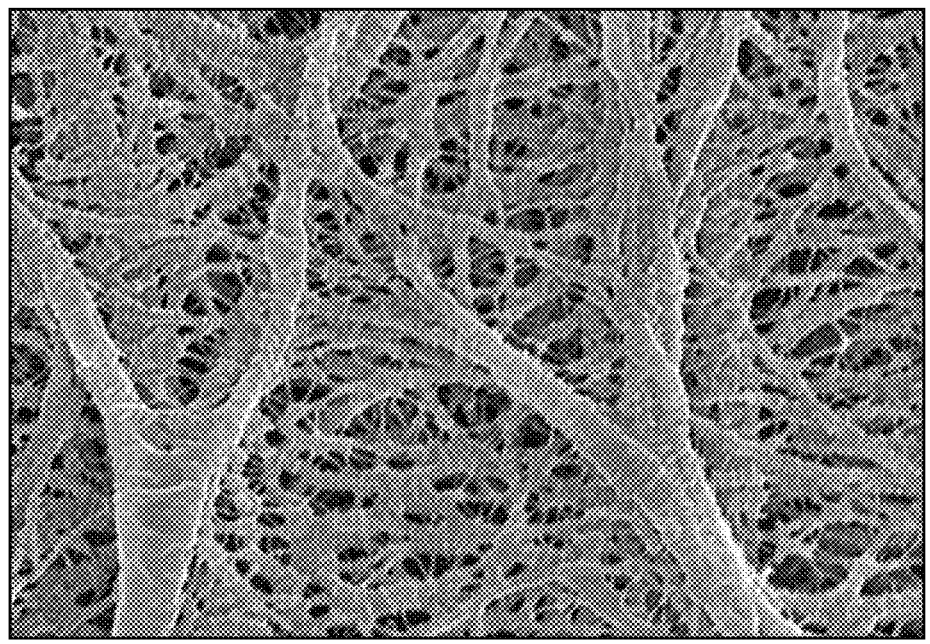
Figure 3B:
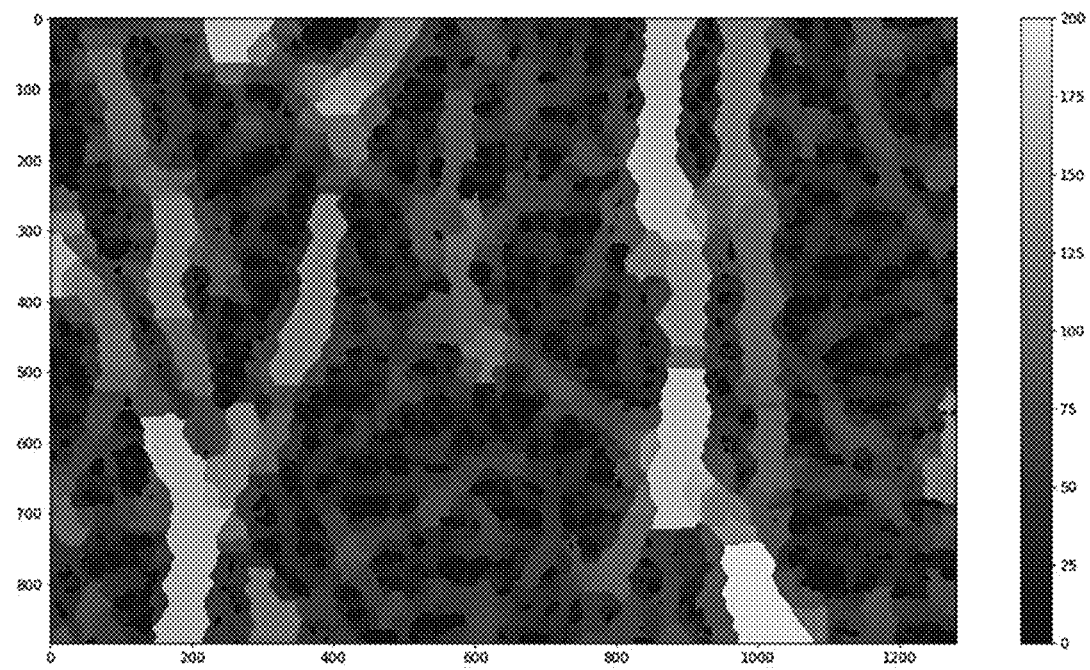
Figure 3C:
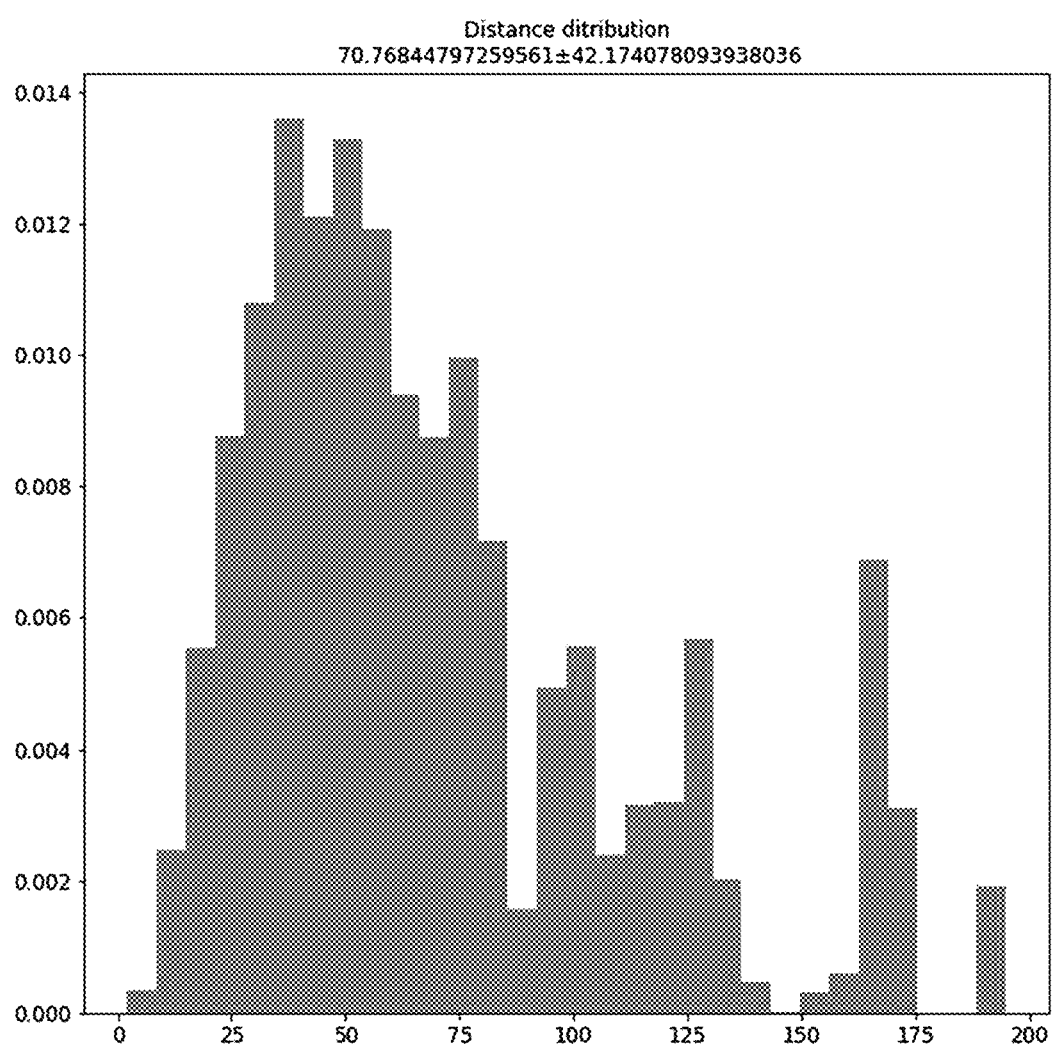
Figure 4A:
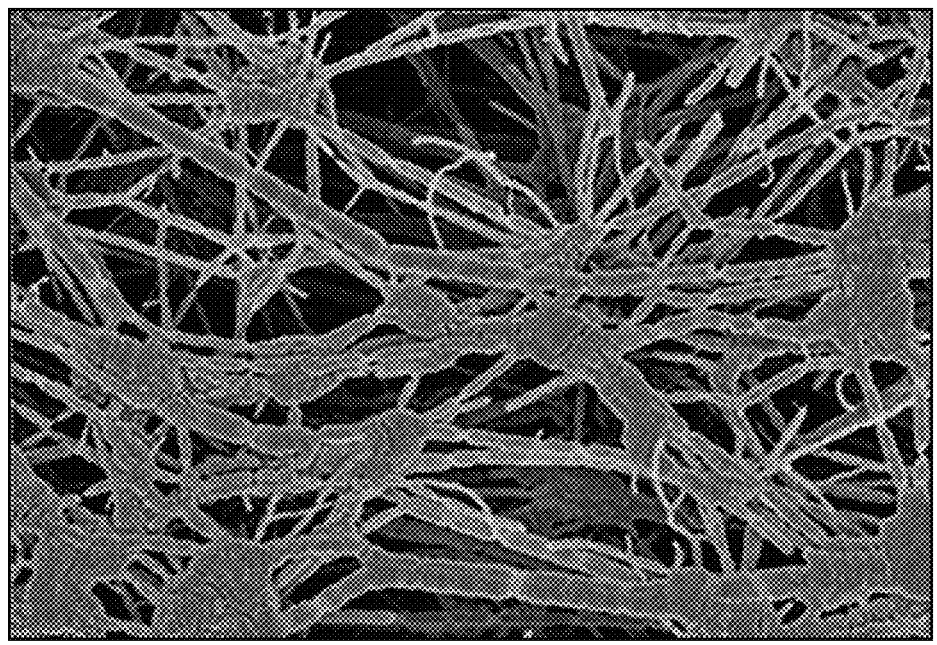
Figure 4B:
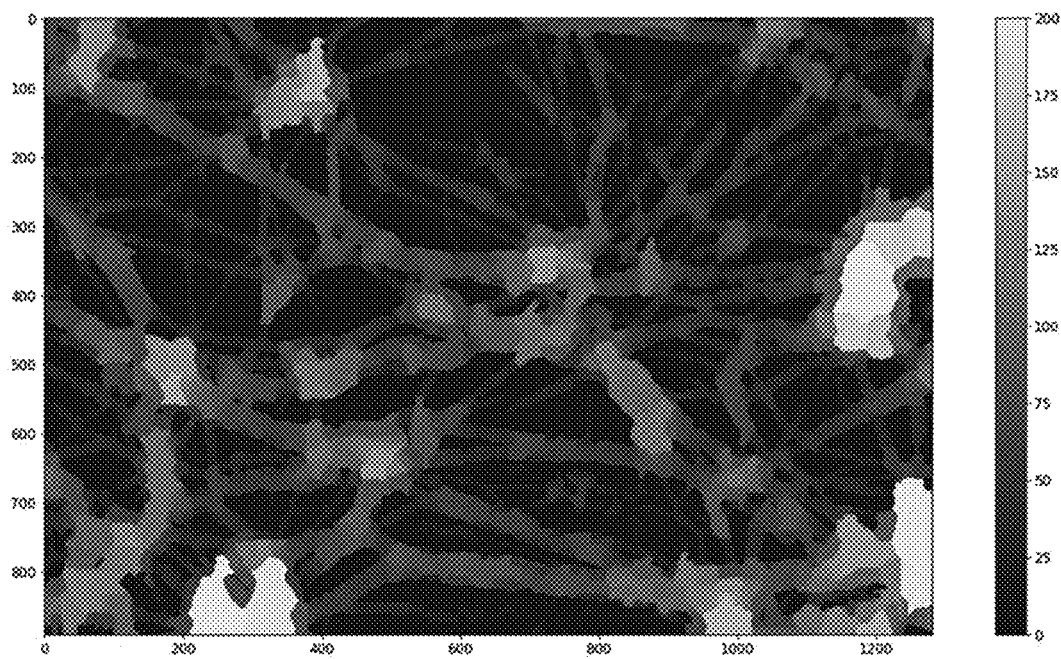
Figure 4C:
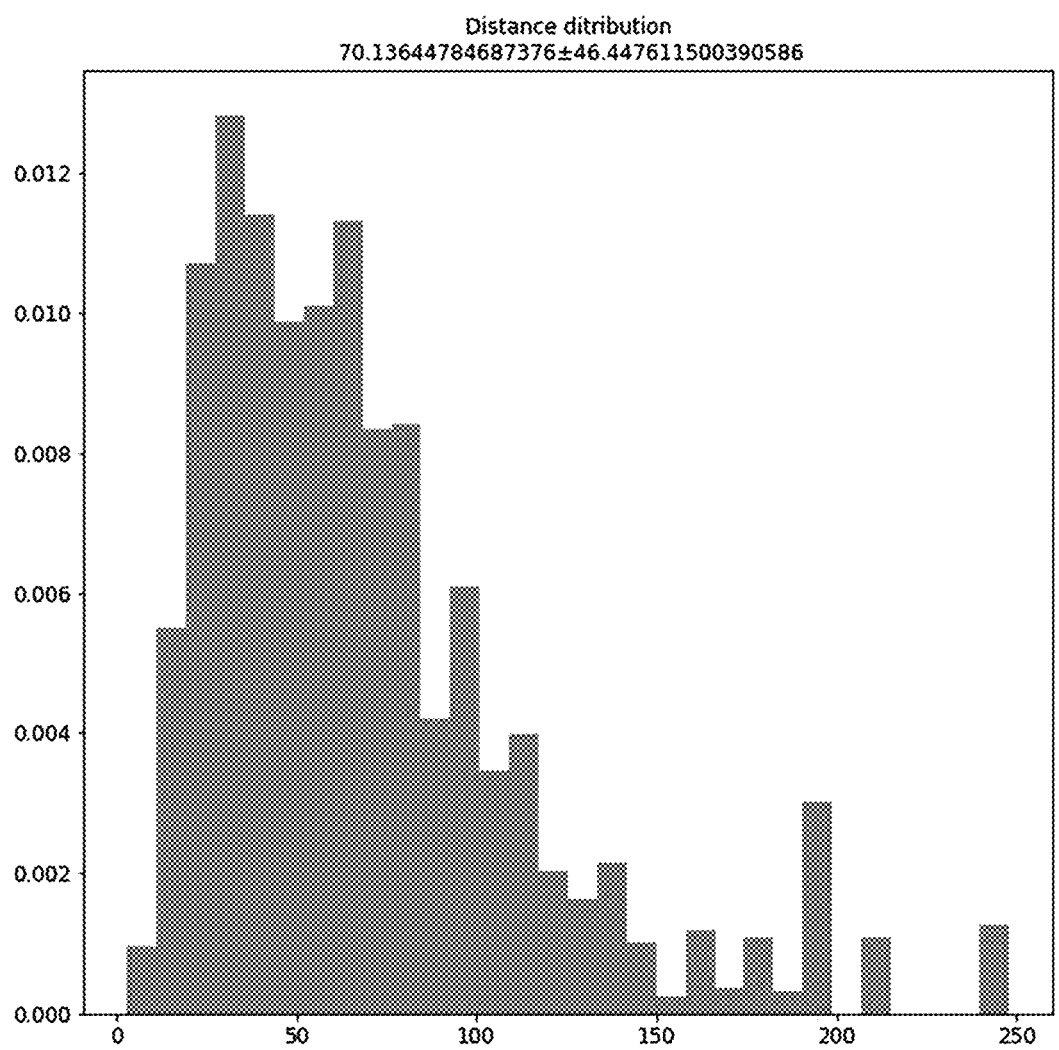
Figure 5A:
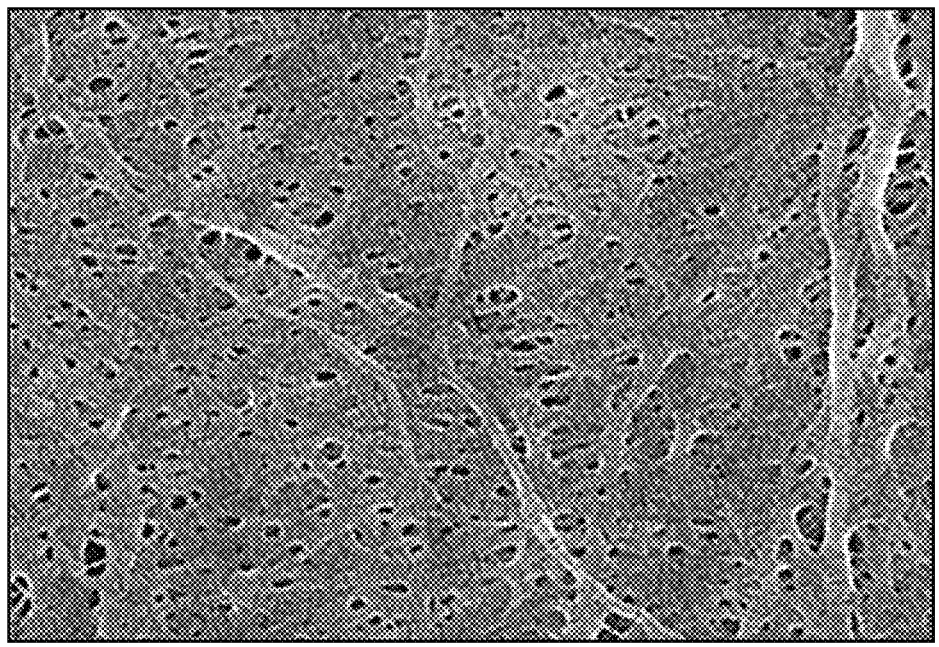
Figure 5B:
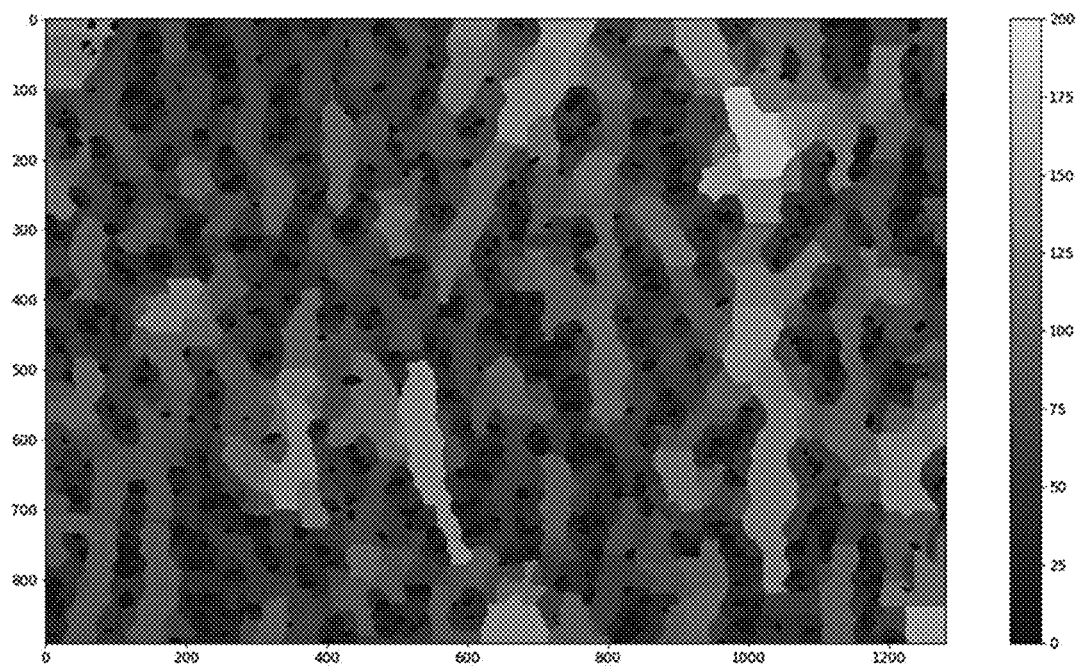
Figure 5C:
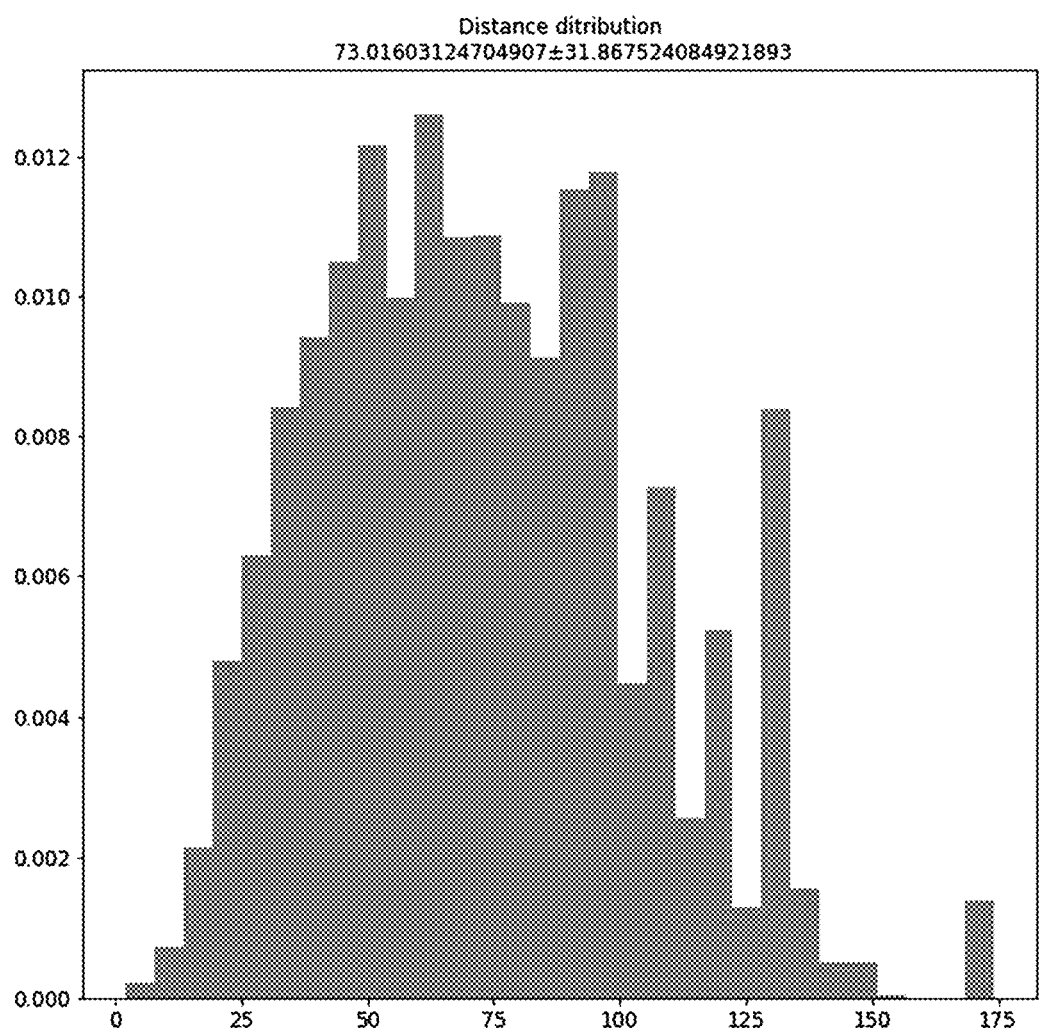
Figure 6A:
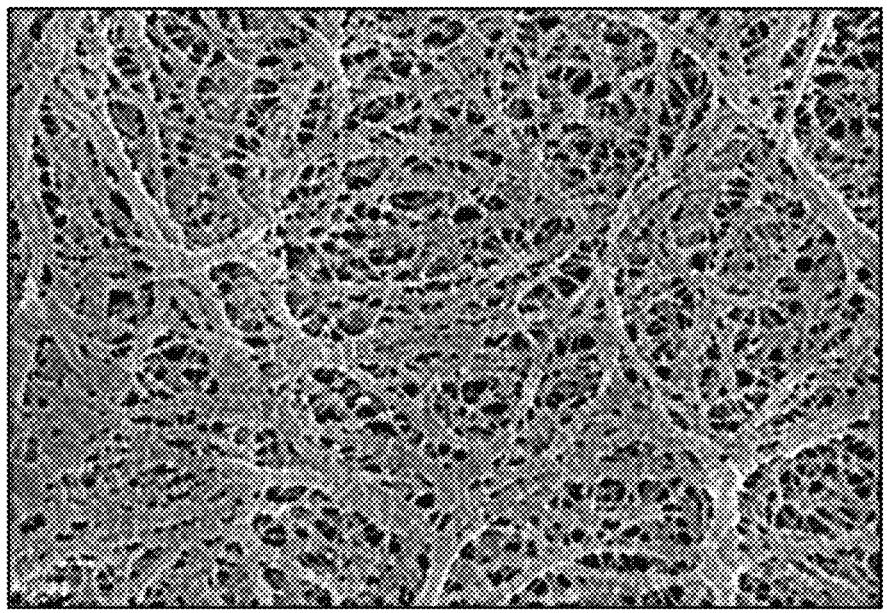
FIG. 6a to FIG. 6d illustrate the raw image of the porous polyolefin substrate according to Preparation Example 1, two-dimensional (2-D) binary image thereof, graph of quantified average value (average PDI before correction) of pore distribution index thereof, and corrected average value (corrected average PDI) of pore distribution index thereof, respectively.
Figure 6B:
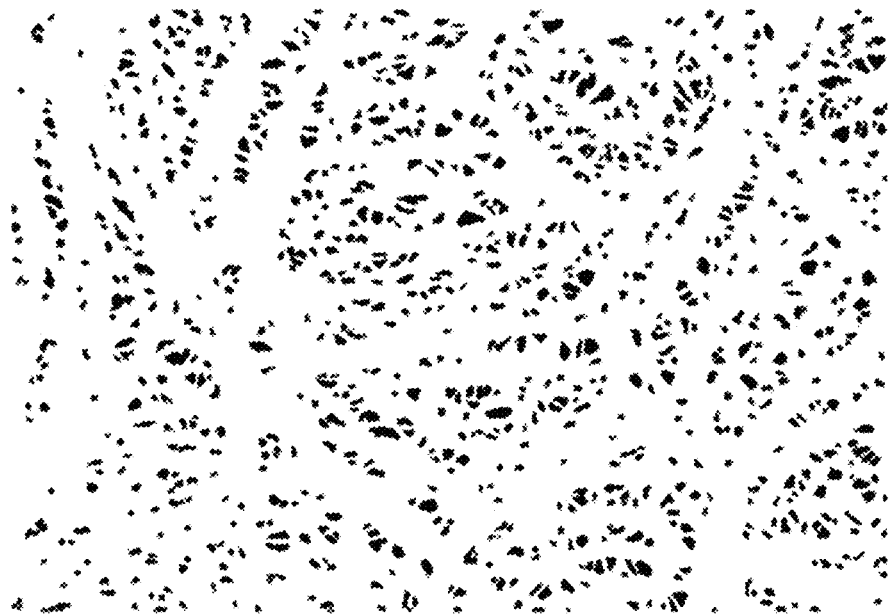
Figure 6C:
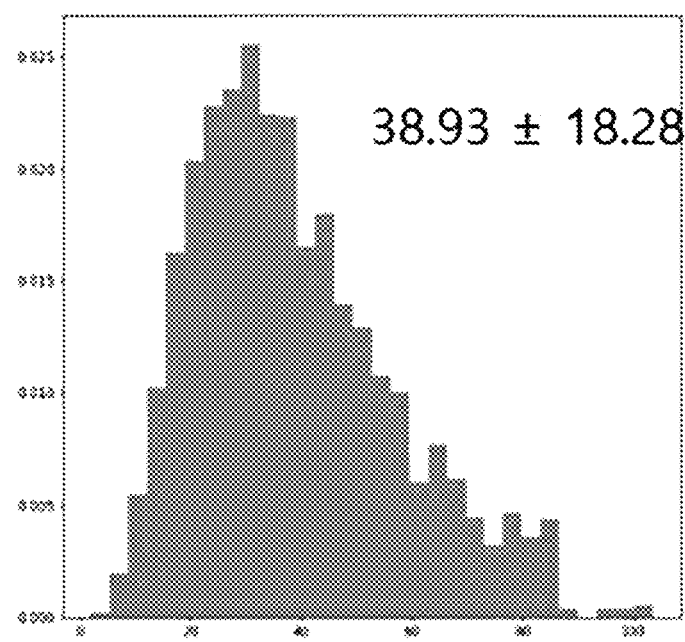
Figure 6D:
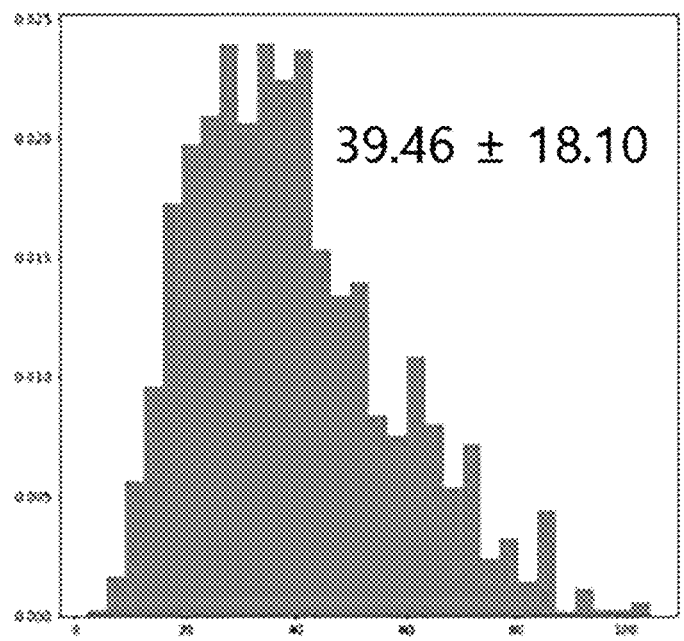
Figure 7A:
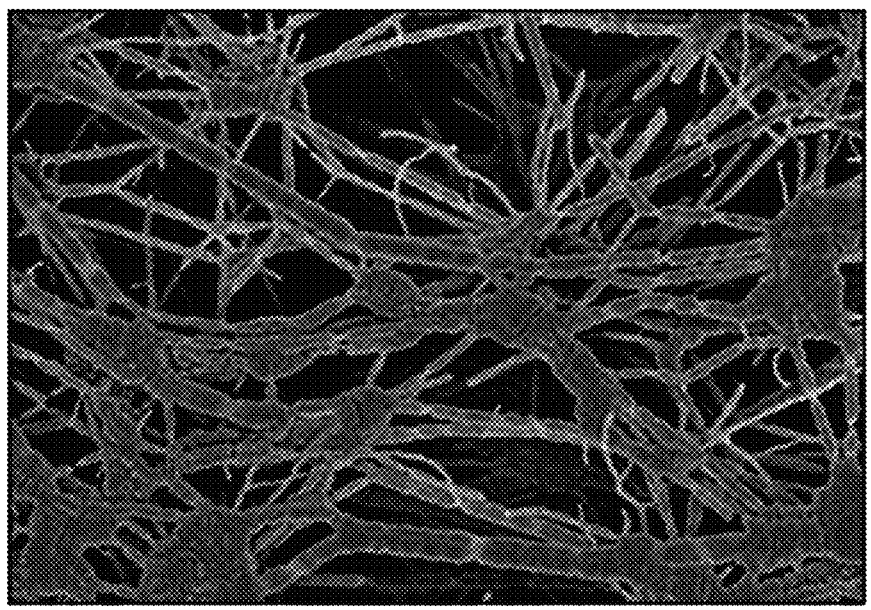
FIG. 7a to FIG. 7d illustrate the raw image of the porous polyolefin substrate according to Preparation Example 4, two-dimensional (2-D) binary image thereof, graph of quantified average value (average PDI before correction) of pore distribution index thereof, and corrected average value (corrected average PDI) of pore distribution index thereof, respectively.
Figure 7B:
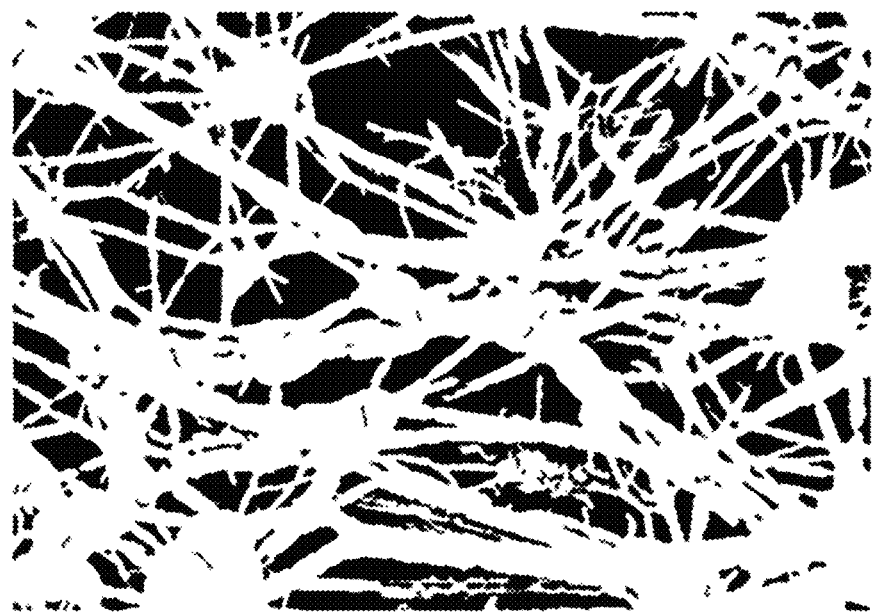
Figure 7C:
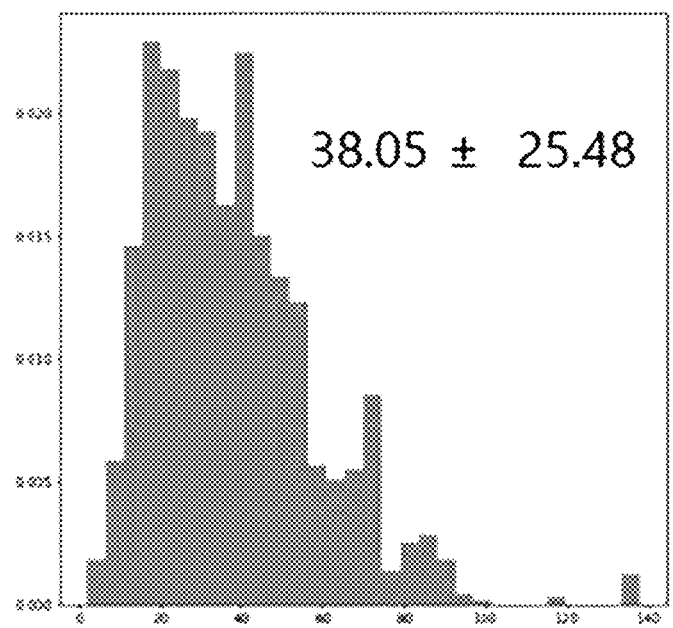
Figure 7D:
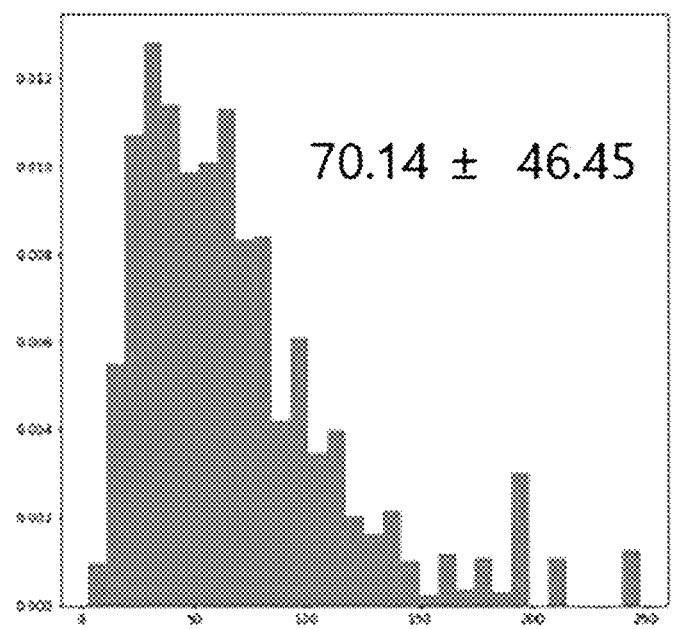

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

In one aspect of the present disclosure, there is provided a method for pre-detecting a defective porous polymer substrate for a separator, including the steps of:

selecting a porous polymer substrate having a plurality of pores to detect whether it is a good product or a defective product;

observing the selected porous polymer substrate with a scanning electron microscope (SEM) to obtain an image of the porous polymer substrate;

quantifying the average value of pore distribution index (PDI) by using the image of the porous polymer substrate;

correcting the quantified average value of pore distribution index to obtain the corrected average value of pore distribution index;

determining whether or not the corrected average value of pore distribution index is 60 a.u. (arbitrary unit) or less; and classifying the porous polymer substrate as a good product, when the corrected average value of pore distribution index is determined to be 60 a.u. or less, and classifying the porous polymer substrate as a defective product, when the corrected average value of pore distribution index is determined to be larger than 60 a.u.

First, a porous polymer substrate having a plurality of pores is selected to detect whether it is a good product or a defective product.

Herein, the porous polymer substrate refers to a separator substrate before forming an organic-inorganic composite porous layer thereon, in a separator provided with an organic-inorganic composite porous layer. The porous polymer substrate includes a plurality of polymer fibers arranged in parallel with one another or arranged to span with one another, and a plurality of pores formed among the plurality of polymer fibers, and thus may include a fiber region and a pore region.

Particularly, the porous polymer substrate may be a porous polymer film substrate or porous polymer nonwoven web substrate.

The porous polymer film substrate may be a porous polymer film including polyolefin, such as polyethylene or polypropylene. Such a polyolefin porous polymer film substrate realizes a shut-down function at a temperature of 80-130° C.

Herein, the polyolefin porous polymer film may be formed of polymers including polyolefin polymers, such as polyethylene, including high-density polyethylene, linear low-density polyethylene, low-density polyethylene or ultrahigh-molecular weight polyethylene, polypropylene, polybutylene, or polypentene, alone or in combination of two or more of them.

In addition, the porous polymer film substrate may be obtained by molding various polymers, such as polyesters, other than polyolefins, into a film shape. Further, the porous polymer film substrate may have a stacked structure of two or more film layers, wherein each film layer may be formed of polymers including the above-mentioned polymers, such as polyolefins or polyesters, alone or in combination of two or more of them.

In addition, the porous polymer film substrate and porous polymer nonwoven web substrate may be formed of polyolefin, polyester (e.g. polyethylene terephthalate, polybutylene terephthalate, polyethylene naphthalate, etc.), polyacetal, polyamide, polycarbonate, polyimide, polyetherether ketone, polyether sulfone, polyphenylene oxide, polyphenylene sulfide, or the like, alone or in combination, besides the above-mentioned polyolefins.

There is no particular limitation in the thickness of the porous polymer substrate, the porous polymer substrate has a thickness of 1-100 μm, particularly 5-50 μm. In addition, although the size of pores present in the porous polymer substrate and the porosity are not particularly limited, the pore size and the porosity may be 0.01-50 μm and 10-95%, respectively.

Particularly, the porous polymer substrate may be a porous polyolefin substrate, wherein the polyolefin may include: polyethylene; polypropylene; polybutylene; polypentene; polyhexene; polyoctene; a copolymer of at least two of ethylene, propylene, butene, pentene, 4-methylpentene, hexane, heptane and octene; or a mixture thereof.

More particularly, the polyethylene may include low-density polyethylene (LDPE), linear low-density polyethylene (LLDPE), high-density polyethylene (HDPE), or the like. Among those, high-density polyethylene having a high crystallization degree and a high resin melting point may be used frequently.

According to an embodiment of the present disclosure, the polyolefin may have a weight average molecular weight of 200,000-1,500,000, 220,000-100,000, 250,000-800,000, or 250,000-600,000. According to the present disclosure, high-molecular weight polyolefin having a weight average molecular weight of 200,000-1,000,000 may be used as a starting material for manufacturing the separator. In this manner, it is possible to obtain a separator having excellent strength and heat resistance, while ensuring the uniformity and film-forming processability of the separator.

Next, the selected porous polymer substrate is observed with a scanning electron microscope (SEM) to obtain an image of the porous polymer substrate.

According to an embodiment of the present disclosure, the image of the porous polymer substrate may be obtained with a scanning electron microscope at a magnification of 20,000 under the condition of 5 kV and 10 μA.

The obtained image of the porous polymer substrate is used to quantify the average value of pore distribution index (PDI).

The step of quantifying the average value of pore distribution index may be carried out by processing the image of the porous polymer substrate taken with a scanning electron microscope (SEM) through the mathematical theory (Euclidean distance measurement) and a computer engineering algorithm.

The step of quantifying the average value of pore distribution index may include calculating a distance between pores and pore size (ratio of area) from the image of the porous polymer substrate taken with a scanning electron microscope (SEM).

According to an embodiment of the present disclosure, the step of quantifying the average value of pore distribution index may include: acquiring a two-dimensional (2-D) binary image in which the pixels of the raw image of the porous polymer substrate taken with a scanning electron microscope (SEM) are divided into pixels representing a plurality of polymer fibril regions adjacent to each other or spanning each other and pixels representing pore regions formed among the plurality of polymer fibrils; carrying out distance transformation of the 2-D binary image by using the computational Euclidean distance transformation method; and applying local maxima calculation to the image subjected to distance transformation to extract the distance transformation values of all of the pixels in the image and carrying out statistical processing.

Herein, the step of applying local maxima calculation to the image subjected to distance transformation to extract the distance transformation values of all of the pixels in the image and carrying out statistical processing may include: separating the image subjected to distance transformation into segments with the local minima of the distance transformation value taken as a boundary; and filling the local maxima of the distance transformation value of the separated segments with the distance transformation value of all of the pixels of the separated segments, and carrying out statistical processing by totally extracting the distance transformation value of each pixel.

Figure 8:
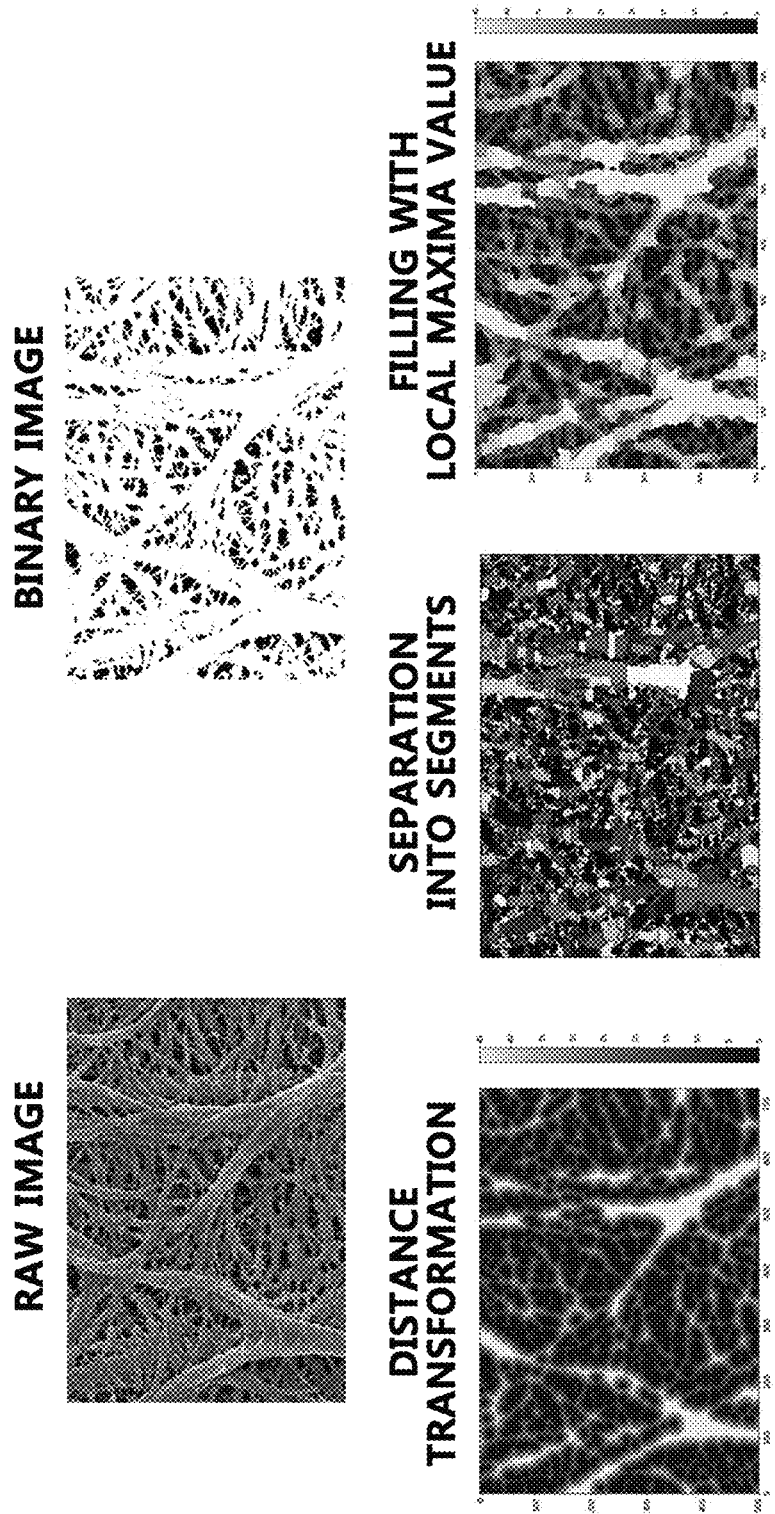
FIG. 8 illustrates a series of steps of quantifying the average value of pore distribution index from a raw image.

FIG. 8 illustrates a series of steps of quantifying the average value of pore distribution index from the raw image.

Then, the quantified average value of pore distribution index is corrected to obtain the corrected average value of pore distribution index.

The porous polymer substrate includes polymer fibril arrays forming the same and pores formed among the adjacent polymer fibrils, wherein the physical properties, such as air permeability, of the porous polymer substrate required as a separator substrate may be affected by the distribution and area of the pore regions.

In other words, even when porous polymer substrates have the same average value of quantified pore distribution index, they may show different physical properties depending on the area of pore regions formed in each porous polymer substrate. Therefore, according to the present disclosure, the average value of quantified pore distribution index is corrected.

Particularly, since the quantified pore distribution index is obtained by calculating the distance to the pores based on pixels corresponding to fibrils, there is a limitation in that the quantified pore distribution index cannot reflect the pore area characteristics. Thus, the ratio of the number of polymer fibril pixels based on the total number of image pixels is defined as a correction factor ($\eta$), and the average value of pore distribution index is divided by the correction factor so that the average value of pore distribution index may be increased, when the pores are large and abundant. In this manner, it is possible to reflect the pore region characteristics.

The step of correcting the quantified average value (average PDI before correction) of pore distribution index to obtain the corrected average value (corrected average PDI) of pore distribution index may be carried out through the calculation according to the following formula:

Corrected average PDI=Average PDI before correction×(1/$\eta$), wherein $\eta$ represents a correction factor and is defined by the formula of $\eta$=(number of polymer fibril pixels)/(number of total image pixels).

Then, it is determined whether or not the corrected average value of pore distribution index is 60 a.u. (arbitrary unit) or less. Herein, the porous polymer substrate is classified as a good product, when the corrected average value of pore distribution index is determined to be 60 a.u. or less. On the other hand, the porous polymer substrate is classified as a defective product, when the corrected average value of pore distribution index is determined to be larger than 60 a.u.

According to an embodiment of the present disclosure, the porous polymer substrate may be classified as a good product, when the corrected average value of pore distribution index is determined to be 40 a.u. or less, while it may be classified as a defective product, when the corrected average value of pore distribution index is determined to be larger than 40 a.u.

In the case of a porous polymer substrate showing a corrected average value of pore distribution index of 60 a.u. or less, the porous polymer substrate before forming the organic-inorganic composite porous layer may show a similar level of air permeation time as compared to a porous polymer substrate showing a corrected average value of pore distribution index of larger than 60 a.u. However, the separator obtained after forming the organic-inorganic composite porous layer on the porous polymer substrate showing a corrected average value of pore distribution index of 60 a.u. or less realizes significantly improved air permeability characteristics, as compared to the porous polymer substrate showing a corrected average value of pore distribution index of larger than 60 a.u. In other words, in the porous polymer substrate showing a corrected average value of pore distribution index of 60 a.u. or less, the pores positioned in the porous polymer substrate are distributed uniformly with a more uniform area. Therefore, the porous polymer substrate does not undergo significant deterioration of air permeability characteristics, even when the organic-inorganic composite porous layer is introduced thereto and a severe condition is provided in terms of retention of air permeability, and thus can realize performance suitable for the application to a separator for a secondary battery.

According to the present disclosure, the porous polymer substrate, which is to be detected whether it is a defective substrate or not, may be used as a separator as it is. However, in the field requiring higher thermal stability, the organic-inorganic composite porous layer may be provided on at least one surface of the porous polymer substrate to provide a separator having reinforced stability.

Such a separator including the organic-inorganic composite porous layer on at least one surface thereof and having reinforced stability includes an organic-inorganic composite porous layer disposed on at least one surface of the porous polymer substrate, and containing a plurality of inorganic particles, and a binder polymer disposed partially or totally on the surfaces of the inorganic particles to interconnect and fix the inorganic particles.

The binder polymer may be one used conventionally for forming an organic-inorganic composite porous layer in the art. Particularly, a polymer having a glass transition temperature ($T_g$) of −200 to 200° C. may be used. This is because such a polymer can improve the mechanical properties, such as flexibility and elasticity, of the finally formed organic-inorganic composite porous layer. Such a binder polymer functions as a binder which interconnects the inorganic particles with one another and stably fixes them, and thus contributes to prevention of degradation of the mechanical properties of the separator having the organic-inorganic composite porous layer.

In addition, it is not essentially required for the binder polymer to have ion conductivity. However, when using a polymer having ion conductivity, it is possible to further improve the performance of an electrochemical device. Therefore, a binder polymer having a dielectric constant as high as possible may be used. In fact, since the dissociation degree of a salt in an electrolyte depends on the dielectric constant of the solvent for the electrolyte, a binder polymer having a higher dielectric constant can improve the salt dissociation degree in an electrolyte. The binder polymer may have a dielectric constant ranging from 1.0 to 100 (measured at a frequency of 1 kHz), particularly 10 or more.

In addition to the above-mentioned function, the binder polymer may be characterized in that it is gelled upon the impregnation with a liquid electrolyte and thus shows a high degree of swelling. Thus, the binder polymer has a solubility parameter (i.e., Hildebrand solubility parameter) of 15-45 MPa$^{1/2}$ or 15-25 MPa$^{1/2}$ and 30-45 MPa$^{1/2}$. Therefore, hydrophilic polymers having many polar groups may be used more frequently as compared to hydrophobic polymers, such as polyolefins. When the solubility parameter is less than 15 MPa$^{1/2}$ and more than 45 MPa$^{1/2}$, it is difficult for the binder polymer to be swelled with a conventional liquid electrolyte for a battery.

Non-limiting examples of the binder polymer include but are not limited to: polyvinylidene fluoride-co-hexafluoropropylene, polyvinylidene fluoride-co-trichloro ethylene, polymethyl methacrylate, polyethylhexyl acrylate, polybutyl acrylate, polyacrylonitrile, polyvinyl pyrrolidone, polyvinyl acetate, polyethylene-co-vinyl acetate, polyethylene oxide, polyarylate, cellulose acetate, cellulose acetate butyrate, cellulose acetate propionate, cyanoethylpullulan, cyanoethylpolyvinylalchol, cyanoethyl cellulose, cyanoethyl sucrose, pullulan and carboxymethyl cellulose.

Non-limiting examples of the inorganic particles may include inorganic particles having a dielectric constant of 5 or more, particularly 10 or more, inorganic particles having lithium-ion transportability and a mixture thereof.

Non-limiting examples of the inorganic particles having a dielectric constant of 5 or more may include any one selected from the group consisting of $BaTiO_3$, $Pb(Zr,Ti)O_3$ (PZT), $Pb_{1-x}La_xZr_{1-y}Ti_yO_3$ (PLZT), $Pb(Mg_{1/3}Nb_{2/3})O_3$—$PbTiO_3$ (PMN-PT), hafnia ($HfO_2$), $SrTiO_3$, $SnO_2$, $CeO_2$, MgO, $Mg(OH_2)$, NiO, CaO, ZnO, $ZrO_2$, $Y_2O_3$, $Al_2O_3$, $TiO_2$, SiC, AlO(OH), $Al_2O_3 \cdot H_2O$, or a mixture thereof.

As used herein, 'inorganic particles having lithium-ion transportability' refers to inorganic particles containing lithium elements and capable of transporting lithium ions, while not storing lithium. Non-limiting examples of the inorganic particles having lithium-ion transportability include lithium phosphate ($Li_3PO_4$), lithium titanium phosphate ($Li_xTi_y(PO_4)_3$, $0<x<2$, $0<y<3$), lithium aluminum titanium phosphate ($Li_xAl_yTi_z(PO_4)_3$, $0<x<2$, $0<y<1$, $0<z<3$), $(LiAlTiP)_xO_y$-based glass ($1<x<4$, $0<y<13$), such as $14Li_2O$-$9Al_2O_3$-$38TiO_2$-$39P_2O_5$, lithium lanthanum titanate ($Li_xLa_yTiO_3$, $0<x<2$, $0<y<3$), lithium germanium thiophosphate ($Li_xGe_yP_zS_w$, $0<x<4$, $0<y<1$, $0<z<1$, $0<w<5$), such as $Li_{3.25}Ge_{0.25}P_{0.75}S_4$, lithium nitride ($Li_xN_y$, $0<x<4$, $0<y<2$), such as $Li_3N$, $SiS_2$-based glass ($Li_xSi_yS_z$, $0<x<3$, $0<y<2$, $0<z<4$), such as $Li_3PO_4$—$Li_2S$—$SiS_2$, and $P_2S_5$-based glass ($Li_xP_yS_z$, $0<x<3$, $0<y<3$, $0<z<7$), such as $LiI$—$Li_2S$—$P_2S_5$, or a mixture thereof.

According to an embodiment of the present disclosure, the organic-inorganic composite porous layer may be an organic coating layer using organic slurry or an aqueous coating layer using aqueous slurry. Particularly, the aqueous coating layer is more advisable in that it facilitates thin film coating and reduces the resistance of a separator.

The separator including an organic-inorganic composite porous layer on at least one surface of a porous polymer substrate and having reinforced stability may be obtained as follows.

First, in order to form the organic-inorganic composite porous layer, a slurry (composition) for forming an organic-inorganic composite porous layer is prepared by dissolving or dispersing the binder polymer in a dispersion medium, adding the inorganic particles thereto and dispersing them therein. The inorganic particles may be added after it is pulverized in advance to a predetermined average particle diameter. Otherwise, the inorganic particles may be added to the mixture of the binder polymer with the dispersion medium, and then pulverized and dispersed, while controlling them to have a predetermined average particle diameter by using a ball milling process, or the like.

The composition for forming an organic-inorganic composite porous layer is coated on the porous polymer substrate. Although there is no particular limitation in the coating method, it is preferred to use a slot coating or dip coating process. A slot coating process includes coating a composition supplied through a slot die onto the whole surface of a substrate and is capable of controlling the thickness of a coating layer depending on the flux supplied from a metering pump. In addition, a dip coating process includes dipping a substrate into a tank containing a composition to carry out coating and is capable of controlling the thickness of a coating layer depending on the concentration of the composition and the rate of removing the substrate from the tank. Further, in order to control the coating thickness more precisely, it is possible to carry out post-metering through a Mayer bar or the like, after dipping.

Then, the porous polymer substrate coated with the composition for forming an organic-inorganic composite porous layer may be dried in a dryer, such as an oven, to form the organic-inorganic composite porous layer on at least one surface of the porous polymer substrate.

According to an embodiment of the present disclosure, the binder polymer attaches the inorganic particles to one another so that they may retain their binding states (i.e. the binder polymer interconnects the inorganic particles and fixes them). In addition, the inorganic particles are bound to the porous polymer substrate by the binder polymer. In the organic-inorganic composite porous layer, the inorganic particles may form interstitial volumes, while they are substantially in contact with one another. Herein, the interstitial volumes mean spaces defined by the inorganic particles that are substantially in contact with one another in a closely packed or densely packed structure of the inorganic particles. The interstitial volumes among the inorganic particles become vacant spaces to form pores of the organic-inorganic composite porous layer.

Non-limiting examples of the dispersion medium include any one selected from acetone, tetrahydrofuran, methylene chloride, chloroform, dimethyl formamide, N-methyl-2-pyrrolidone, methyl ethyl ketone, cyclohexane, methanol, ethanol, isopropyl alcohol, propanol and water, or a mixture of two or more of them.

In addition, according to an embodiment of the present disclosure, after the composition for forming an organic-inorganic composite porous layer is coated on the porous polymer substrate, it may be dried at a temperature of 20-70° C. or 23-60° C. under a relative humidity of 30-80% or 50-80% for 1 minutes to 2 hours, 5 minutes to 1 hour, or 10 minutes to 1 hour to remove the solvent. In this manner, it is possible to prepare the separator including the organic-inorganic composite porous layer on at least one surface thereof and having reinforced stability.

The separator obtained by applying and drying the slurry containing the inorganic particles, the binder polymer and the dispersion medium on at least one surface of the porous substrate classified as a good product to form the organic-inorganic composite porous layer may have excellent air permeability characteristics of 600 sec/100 cc or less.

When using the method for pre-detecting a defective porous polymer substrate for a separator according to an embodiment of the present disclosure, the results of pre-detecting a good product/defective product obtained by comparing the corrected average value of pore distribution index in the state of a porous polymer substrate with the reference value may completely correspond to the results of air permeability characteristics of the finished separator provided with the organic-inorganic composite porous layer.

Examples will be described more fully hereinafter so that the present disclosure can be understood with ease. The following examples may, however, be embodied in many different forms and should not be construed as limited to the exemplary embodiments set forth therein. Rather, these exemplary embodiments are provided so that the present disclosure will be thorough and complete, and will fully convey the scope of the present disclosure to those skilled in the art.

Preparation Example 1

(1) Preparation of Porous Polymer Substrate

First, 9.0 kg/hr of high-density polyethylene (Korea Petrochemical Ind. Co. Ltd., VH035) having a weight average molecular weight of 350,000, as polyolefin, and 21.0 kg/kr of liquid paraffin oil (Kukdong Oil & Chem. LP350F, 68 cSt) as a diluting agent were introduced to an extruder and mixed therein.

Herein, the extruder was a biaxial extruder including a hopper configured to introduce the polyolefin and diluting agent, a kneading unit configured to convey and mix the introduced ingredients, and a die outlet configured to extrude the mixed ingredients.

The polyethylene composition extruded through the extruder was molded into a sheet-like shape through a T-die and cold casting roll. Then, biaxial orientation was carried out by using a tenter-type sequential orientation machine performing MD (machine direction) orientation and then TD (transverse direction) orientation. Herein, each of the MD orientation ratio and the TD orientation ratio was 7.0. The orientation temperature was 110° C. in MD and 125° C. in TD.

Then, the diluting agent was extracted from the oriented sheet by using methylene chloride, and thermal fixing of the sheet from which the diluting agent was extracted was carried out at a temperature of 126° C. to obtain a polyolefin separator. Herein, in the thermal fixing step, the sheet introduced to the thermal fixing step was elongated to 40% of the width thereof in the transverse direction of the sheet, and then released to 15% to obtain a porous polyolefin substrate (porous polymer substrate). The resultant porous polyolefin substrate had a thickness of 8.6 μm.

(2) Preparation of Separator Having Organic-Inorganic Composite Porous

First, polyvinylidene fluoride-co-hexafluoropropylene (PVDF-HFP) (weight average molecular weight 390,000, HFP content 8 wt %) and polyvinylidene fluoride-co-chlorotrifluoroethylene (PVDF-CTFE) (weight average molecular weight 450,000, CTFE content 20 wt %) as binder polymers, and cyanoethylvinyl alcohol as a dispersing agent (also functioning as a binder polymer) were added to acetone and dissolved therein at 50° C. for about 12 hours to prepare a binder polymer solution. Then, alumina $Al_2O_3$ (average particle diameter 500 nm) as inorganic particles was added to the resultant binder polymer solution and dispersed therein to prepare a slurry for an organic-inorganic composite porous layer. Herein, the weight ratio of PVDF-HFP:PVDF-CTFE:dispersing agent:coupling agent:inorganic particles was 21:7:1:1:70.

The resultant slurry for an organic-inorganic composite porous layer was coated on both surfaces of the porous polyolefin substrate prepared as described above and dried at a temperature of 23° C. under a relative humidity of 50% for 10 minutes to obtain a separator having organic-inorganic composite porous layers on both surfaces thereof (total thickness of organic-inorganic composite porous layers on both surfaces: about 6 μm.)

Preparation Example 2

A porous polyolefin substrate was obtained in the same manner as Preparation Example 1, except that 7.0 kg/hr of high-density polyethylene (Korea Petrochemical Ind. Co. Ltd., VH035) having a weight average molecular weight of 350,000 and 2.0 kg/kr of high-density polyethylene (Korea Petrochemical Ind. Co. Ltd., VH105U) having a weight average molecular weight of 600,000, as polyolefin, were introduced to the extruder. Herein, the resultant porous polyolefin substrate had a thickness of 9.0 μm.

In addition, a separator having organic-inorganic composite porous layers on both surfaces thereof (total thickness of organic-inorganic composite porous layers on both surfaces: about 6 μm) was obtained in the same manner as Preparation Example 1, except that the porous polyolefin substrate obtained as described above was used.

Preparation Example 3

A porous polyolefin substrate was obtained in the same manner as Preparation Example 1, except that the orientation temperature in TD was controlled to 130° C. Herein, the resultant porous polyolefin substrate had a thickness of 9.1 μm. In addition, the orientation temperature in TD of 130° C. simulates a slight increase in processing temperature caused by some troubles in the air supply/exhaust motor, heater, filter, or the like, in TD orientation during the manufacturing process.

In addition, a separator having organic-inorganic composite porous layers on both surfaces thereof (total thickness of organic-inorganic composite porous layers on both surfaces: about 6 μm) was obtained in the same manner as Preparation Example 1, except that the porous polyolefin substrate obtained as described above was used.

Preparation Example 4

A separator for a process filter, not a separator for a lithium secondary battery, was used to determine the corrected average PDI. Such a separator had an average pore diameter of 120 nm and a maximum pore size of 140 nm, and thus could not be used as a separator for a secondary battery.

The separator for a process filter was obtained by the following process.

First, 100 parts by weight of PTFE resin 650J™ (available from MCF Co.) was mixed with 22 parts by weight of lubricant oil (Isopar H, available from Exxon Co.) to prepare a fluorinated resin-containing composition, and the composition was aged at 38° C. for 24 hours. Next, a preform block was manufactured by applying a pressure of 4 MPa, and the preform block was extruded in the form of a sheet having a thickness of 1 mm by using a paste extruder. Then, the sheet was pressed through calendering to a thickness of 300 μm to obtain a PTFE film. The resultant PTFE film was heat treated in an oven heated to 200° C. through a roll-to-roll process to remove the lubricant completely.

The heat treated PTFE film was oriented by 3 times in the machine direction by using a roll speed difference at 300° C., and the roll speed was reduced to carry out relaxation in such a manner that shrinking might occur at 10% in the machine direction (MD) at 310° C.

After that, orientation was carried out by 10 times in the transverse direction by using a roll speed difference at 280° C., and the film was thermally fixed at 370° C. by using a heating roll for 9 seconds to obtain a PTFE porous membrane as a separator for a process filter.

Preparation Example 5

A porous polyolefin substrate was obtained in the same manner as Preparation Example 1, except that the thermal fixing temperature was increased to 135° C. to simulate temperature-related troubles occurring upon the thermal fixing. Herein, the resultant porous polyolefin substrate had a thickness of 8.7 μm. The separator showed an excessively long air permeation time, and thus could not be used for a secondary battery.

Pre-Detection of Defective Porous Polyolefin Substrate

First, each of the porous polyolefin substrates according to Preparation Examples 1-5 was observed with a scanning electron microscope (SEM) (S-4800, available from Hitach) under the condition of 5 kV and 10 μA at a magnification of 20,000 to obtain the image of each porous polymer substrate. The SEM images of the porous polyolefin substrates according to Preparation Examples 1-5 are shown in FIGS. 1a-5a, respectively.

The images of the porous polymer substrates were used to quantify the average value of pore distribution index (PDI). Herein, in the step of quantifying the average value of PDI, a two-dimensional (2-D) binary image was acquired, wherein the pixels of the raw image of the porous polymer substrate taken with a scanning electron microscope (SEM) were divided into pixels representing a plurality of polymer fibril regions adjacent to each other or spanning each other and pixels representing pore regions formed among the plurality of polymer fibrils. Then, distance transformation of the 2-D binary image was carried out by using the computational Euclidean distance transformation method. The results of distance transformation of the porous polyolefin substrates according to Preparation Examples 1-5 are shown in FIGS. 1b-5b, respectively.

Then, local maxima calculation was applied to the image subjected to distance transformation to extract the distance transformation values of all of the pixels in the image and statistical processing is carried out, thereby providing the quantified average value (average PDI before correction) of pore distribution index.

After that, the quantified average value (average PDI before correction) of pore distribution index was corrected to obtain the corrected average value (corrected average PDI) of pore distribution index according to the following formula:

$$\text{Corrected average PDI} = \text{Average PDI before correction} \times (1/\eta),$$

wherein η represents a correction factor and is defined by the formula of η=(number of polymer fibril pixels)/(number of total image pixels).

The corrected average value (corrected average PDI) of pore distribution index of the porous polyolefin substrate and the graph of the corrected pore distribution index according to each of Preparation Examples 1-5 is shown in each of FIG. 1c, FIG. 2c, FIG. 3c, FIG. 4c and FIG. 5c.

Particularly, FIGS. 6a-6d illustrate the raw image of the porous polyolefin substrate according to Preparation Example 1, two-dimensional (2-D) binary image thereof, graph of quantified average value (average PDI before correction) of pore distribution index thereof, and corrected average value (corrected average PDI) of pore distribution index thereof, respectively. FIGS. 7a-7d illustrate the raw image of the porous polyolefin substrate according to Preparation Example 4, two-dimensional (2-D) binary image thereof, graph of quantified average value (average PDI before correction) of pore distribution index thereof, and corrected average value (corrected average PDI) of pore distribution index thereof, respectively.

Referring to FIGS. 6a-6d and FIGS. 7a-7d, when comparing the raw image and 2-D binary image of the porous polyolefin substrate according to Preparation Example 1 with those of the porous polyolefin substrate according to Preparation Example 4, it can be seen that Preparation Example 1 has pore regions (black colored regions in the 2-D binary image) dispersed uniformly with a regular size, as compared to Preparation Example 4. However, both Preparation Example 1 and Preparation Example 4 show a similar average PDI before correction of about 38 a.u. Then, with reference to the corrected average value (corrected average PDI) of pore distribution index, the porous polyolefin substrate according to Preparation Example 1 shows a value of 39.46 a.u., while the porous polyolefin substrate according to Preparation Example 4 shows a significantly different value of 70.14 a.u.

This is because Preparation Example 1 shows a larger area ratio of white colored regions as compared to the area ratio of white colored regions of Preparation Example 4 in the 2-D binary image, as can be seen from FIGS. 6a-6d and FIGS. 7a-7d, and thus Preparation Example 1 has a larger correction factor, η (0.914) (i.e. ratio of the number of fibril (white colored region) pixels based on the number of total image pixels), as compared to the correction factor (0.667) according to Preparation Example 4.

The following Table 1 shows the quantified average value (average PDI before correction) of pore distribution index, correction factor, and the corrected average value (corrected average PDI) of pore distribution index of the porous polyolefin substrate according to each of Preparation Examples 1-5.

After that, it was determined whether or not the corrected average value (corrected average PDI) of pore distribution index was 60 a.u. or less. Then, when the corrected average value of pore distribution index was determined to be 60 a.u. or less, the porous polymer substrate was classified as a good product, and when the corrected average value of pore distribution index was determined to be larger than 60 a.u, the porous polymer substrate was classified as a defective product. The results are shown in Table 1.

Method for Evaluation of Air Permeability (Air Permeation Time)

The air permeability (Gurley) of the porous polymer substrate according to each of Preparation Examples 1-5 and that of the separator including the organic-inorganic composite porous layer were determined by the method of ASTM D726-94. The results are shown in Table 1. Herein, Gurley refers to resistance against air flow and is determined by a Gurley densometer. The air permeability value described herein is expressed by the time (seconds), i.e. air permeation time, required for 100 cc of air to pass through a section of the porous polymer substrate or separator having an area of 1 in$^2$ under a pressure of 12.2 in H$_2$O.

TABLE 1

|  | Average PDI before correction (a.u.) | Correction factor (η) | Corrected average PDI (a.u.) | Determination of good product/ defective product | Air permeation time (before forming organic-inorganic composite porous layer) (sec/100 cc) | Air permeation time (after forming organic-inorganic composite porous layer) (sec/100 cc) |
|---|---|---|---|---|---|---|
| Prep. Ex. 1 | 38.93 ± 18.28 | 0.914 | 39.46 ± 18.10 | Good product | 59 | 224 |
| Prep. Ex. 2 | 35.51 ± 17.45 | 0.898 | 37.16 ± 18.30 | Good product | 62 | 215 |
| Prep. Ex. 3 | 68.00 ± 40.94 | 0.917 | 70.77 ± 42.17 | Defective product | 67 | 720 |
| Prep. Ex. 4 | 38.05 ± 25.48 | 0.667 | 70.14 ± 46.45 | Defective product | 9 | Porous layer is not formed |
| Prep. Ex. 5 | 70.25 ± 30.66 | 0.962 | 73.02 ± 31.87 | Defective product | 2472 | Porous layer is not formed |

Referring to Table 1, in the case of the porous polymer substrate according to each of Preparation Examples 1 and 2 satisfying a corrected average value of pore distribution index of 60 a.u. or less, it shows an air permeation time similar to the air permeation time of Preparation Example 3 showing a corrected average value of pore distribution index of larger than 60 a.u., in terms of the air permeation time of the porous polymer substrate before forming an organic-inorganic composite porous layer. However, in terms of the air permeation time of the separator obtained after forming an organic-inorganic composite porous layer, the separator according to Preparation Example 1 shows a value of about 210-220 sec/100 cc, which is about 30% lower than the air permeation time of the separator using the porous polymer substrate according to Preparation Example 3 after forming an organic-inorganic composite porous layer. It can be seen from the above result that when using the method for pre-detecting a defective porous polymer substrate for a separator according to an embodiment of the present disclosure, the results of pre-detecting a good product/defective product obtained by comparing the corrected average value of pore distribution index in the state of a porous polymer substrate with the reference value completely correspond to the results of air permeability characteristics of the finished separator provided with the organic-inorganic composite porous layer. According to the related art, a separator including an organic-inorganic composite porous layer is manufactured, and then evaluated in terms of air permeability and defective products are classified and discarded. However, according to the pre-detection method of the present disclosure, defective products can be detected in advance in the state of a porous polymer substrate, and thus it is possible to provide significantly improved time- and cost-efficiency.

What is claimed is:

1. A method for pre-detecting a defective porous polymer substrate for a separator, comprising:
   preparing a porous polymer substrate having a plurality of pores;
   observing the porous polymer substrate with a scanning electron microscope (SEM) to obtain an image of the porous polymer substrate;
   quantifying an average value of pore distribution index (PDI) by using the image of the porous polymer substrate;
   correcting the quantified average value of pore distribution index (PDI) to obtain a corrected average value of pore distribution index;
   determining whether or not the corrected average value of pore distribution index (PDI) is 60 a.u. (arbitrary unit) or less; and
   classifying the porous polymer substrate as a good product when the corrected average value of pore distribution index (PDI) is determined to be 60 a.u. or less, and classifying the porous polymer substrate as a defective product when the corrected average value of pore distribution index (PDI) is determined to be larger than 60 a.u.

2. The method for pre-detecting a defective porous polymer substrate for a separator according to claim 1, wherein the quantifying the average value of pore distribution index (PDI) is carried out by processing the image of the porous polymer substrate through a computational Euclidean distance transformation method.

3. The method for pre-detecting a defective porous polymer substrate for a separator according to claim 2, wherein the quantifying the average value of pore distribution index (PDI) comprises calculating a distance between pores and pore size from the image of the porous polymer substrate.

4. The method for pre-detecting a defective porous polymer substrate for a separator according to claim 2, wherein the quantifying the average value of pore distribution index (PDI) comprises:
   acquiring a two-dimensional (2-D) binary image in which pixels of a raw image of the porous polymer substrate taken with the scanning electron microscope (SEM) are divided into pixels representing a plurality of polymer fibril regions adjacent to each other or spanning each other and pixels representing pore regions formed among the plurality of polymer fibrils;
   carrying out distance transformation of the 2-D binary image by using a computational Euclidean distance transformation method; and
   applying local maxima calculation to the 2-D binary image subjected to distance transformation to extract the distance transformation values of all of the pixels in the 2-D binary image and carrying out statistical processing.

5. The method for pre-detecting a defective porous polymer substrate for a separator according to claim 1, wherein the correcting the quantified average value of pore distribution index (PDI) is carried out through calculation according to the following formula:

Corrected average PDI=Average PDI before correction×(1/η), wherein η represents a correction factor and is defined by the formula of η=(number of polymer fibril pixels)/(number of total image pixels).

6. The method for pre-detecting a defective porous polymer substrate for a separator according to claim 1, wherein a separator, obtained by applying and drying a slurry containing inorganic particles, a binder polymer and a dispersion medium onto at least one surface of the porous substrate classified as the good product to form an organic-inorganic composite porous layer, has an air permeability of 600 sec/100 cc or less.

7. The method for pre-detecting a defective porous polymer substrate for a separator according to claim 1, wherein the porous polymer substrate is classified as the good product when the corrected average value of pore distribution index (PDI) is determined to be 40 a.u. or less, and classified as the defective product when the corrected average value of pore distribution index (PDI) is determined to be larger than 40 a.u.

* * * * *